United States Patent
Diaz, Jr.

(10) Patent No.: US 9,804,218 B2
(45) Date of Patent: Oct. 31, 2017

(54) SYSTEMS AND METHODS FOR TESTING POINT TO POINT CONTACT OF CUSTOMER SPECIFIC CABLES

(71) Applicant: Fast Heat, Inc., Elmhurst, IL (US)

(72) Inventor: Manuel Luna Diaz, Jr., Burbank, IL (US)

( * ) Notice: Subject to any disclaimer, the term of this patent is extended or adjusted under 35 U.S.C. 154(b) by 40 days.

(21) Appl. No.: 15/076,263

(22) Filed: Mar. 21, 2016

(65) Prior Publication Data
US 2016/0274171 A1 Sep. 22, 2016

Related U.S. Application Data

(60) Provisional application No. 62/136,244, filed on Mar. 20, 2015.

(51) Int. Cl.
*G01N 27/00* (2006.01)
*G01R 27/08* (2006.01)
*G01R 31/02* (2006.01)
*G08B 5/36* (2006.01)

(52) U.S. Cl.
CPC ......... *G01R 31/026* (2013.01); *G01R 31/021* (2013.01); *G08B 5/36* (2013.01)

(58) Field of Classification Search
CPC ....... G01R 31/026; G01R 31/021; G08B 5/36
USPC ........................................ 324/540, 555, 707
See application file for complete search history.

(56) References Cited

U.S. PATENT DOCUMENTS

2003/0141875 A1* 7/2003 Seymour .............. G01R 31/021
324/525

* cited by examiner

*Primary Examiner* — Farhana Hoque
(74) *Attorney, Agent, or Firm* — Polsinelli PC; Christopher L. E. Hines

(57) ABSTRACT

Aspects of the present disclosure involve a testing device or apparatus configured to test PTP contacts of user-specified cables capable of transmitting electrical signals along a particular path between two points, such as between a transmitter and a receiver.

10 Claims, 5 Drawing Sheets

SYSTEMS AND METHODS FOR TESTING POINT TO POINT CONTACT OF CUSTOMER SPECIFIC CABLES

CROSS REFERENCE TO RELATED APPLICATIONS

The present non-provisional application claims priority to U.S. Provisional Application No. 62/136,244 entitled "CABLEXCHECKER," filed on Mar. 20, 2015, and which is hereby incorporated by reference in its entirety.

FIELD OF THE INVENTION

Aspects of the present disclosure relate to an apparatus, system, and/or device for checking the electrical continuity of conductors, cables, and/or other contacts, and in particular, the checking of point-to-point contacts of cables.

BACKGROUND

A continuity checker represents a type of electrical test equipment that is often used to determine whether an electrical path can be established between two points of an electrical system. For example, when a conductor cable is employed to connect two points, such two terminal devices, it is often necessary to perform tests to verify that an electrical connection has been established between the two points. Thus, the cables may be tested to verify that: 1) all intended connections exist; 2) no unintended connections exists; 3) there are no miswirings; etc.

Point-To-Point ("PTP") represents a methodology commonly used to depict the physical wiring of a given electrical system, or apparatus. For example, a PTP diagram typically illustrates how electrical devices are physically connected via cables and wires. It is with these aspects in mind that aspects of the present disclosure were conceived.

BRIEF DESCRIPTION OF THE DRAWINGS

The foregoing and other objects, features, and advantages of the present disclosure set forth herein will be apparent from the following description of particular embodiments of those inventive concepts, as illustrated in the accompanying drawings. Also, in the drawings the like reference characters refer to the same parts throughout the different views. The drawings depict only typical embodiments of the present disclosure and, therefore, are not to be considered limiting in scope.

DETAILED DESCRIPTION

Aspects of the present disclosure involve a testing device or apparatus configured to test PTP contacts of user-specified cables capable of transmitting electrical signals along a particular path between two points, such as between a transmitter and a receiver. In various aspects, the testing device or apparatus may include a series of electrical connectors. Generally speaking, electrical connectors operate by connecting ground and power terminals of respective connector elements together in a manner that facilitates electrical continuity between the respective elements. Thus, electrical connectors represent electro-mechanical devices for joining electrical circuits as an interface.

In various embodiments, the electrical connectors of the testing apparatus may be implemented or otherwise designed according to a user-specified wiring diagram, such as a PTP wiring diagram. Generally speaking, PTP represents a methodology commonly used to depict the physical wiring of a given electrical system, or apparatus. For example, a PTP diagram will often illustrate how a given device is physically connected to wires, namely the actual PTP wiring connections, system component interconnections, used and unused terminal designations and terminal boards, wire run layouts, and/or the like. Instead of building out cables for testing, the testing devices and/or apparatuses described herein are implemented based on a customer's existing connectors and/or cables, as described in a PTP wiring diagram. Although the various examples described herein refer to PTP wiring diagrams, it is contemplated that any type of wiring diagram may be used.

Figure 1A:
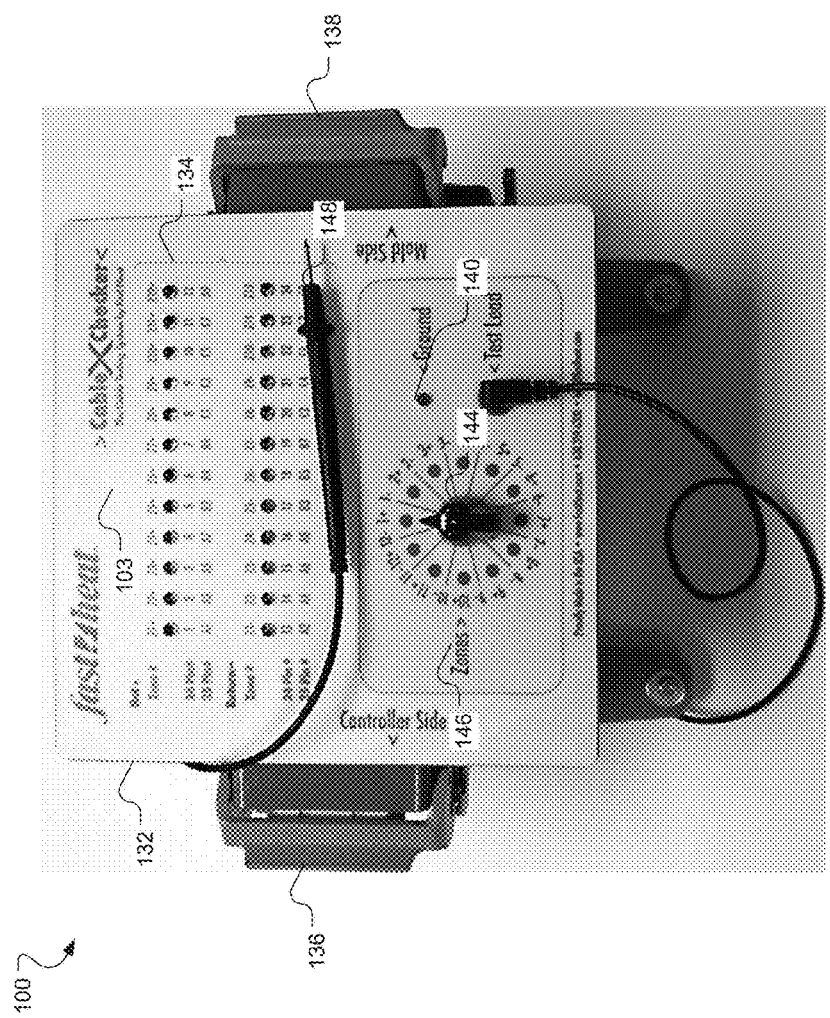
FIG. 1A is a block diagram of a testing apparatus, according to one embodiment of the present disclosure.

FIG. 1A provides an illustration of a testing fixture and/or apparatus 100 that may be used to test cables and/or wires for potential continuity issues, according to one embodiment. As illustrated, the testing fixture and/or apparatus includes a housing/casing 132 having the external appearance of a square and/or rectangular box. Cable connector ends 136 and 138 allow customer cables for test to be connected or otherwise plugged into the housing/casing 132 of the testing fixture and/or apparatus 100.

The testing fixture and/or apparatus 100 further includes a top portion or lid 103 that is operatively connected to the housing/casing 132 and which displays a series of visual indicators (collectively referenced as 134) that protrude from the lid 103 of the housing/casing 132. For example, in one embodiment, the visual indicators may be one more light emitting diodes (LEDs) mounted within the housing/casing 132 that are operatively interconnected within the circuitry of the housing/casing 132, as will be further described in detail below. The visual indicators 144 provide a visual indication of the continuity of the cable being tested. For example and as will be further described in detail below, depending on which visual indicator 134 is illuminated, it can be determined whether the cable (and/or portion of the cable) provides a good, consistent, and/or strong signal, contains a loss of continuity, contains shortages, is improperly wired, and/or the like.

In some embodiments, the testing fixture and/or apparatus 100 may further include a dial 134 that may be manipulated by an operator to identify a specific zone of the customer cable for testing. Stated differently, manipulation of the dial 144 may cause the testing fixture and/or apparatus 100 to automatically test the customer cable connected to the testing fixture and/or apparatus 100 within an applicable zone 146 that corresponds to different wires of the cable being tested. In other embodiments, the testing fixture and/or apparatus 100 may include a test probe 148 that is operatively interconnected with the circuitry of the housing/casing 132. The test probe 148 may be used to test the continuity of ground connections, which corresponds to a particular visual indicator indicating the success of the connection to the ground at 140.

Figure 1B:
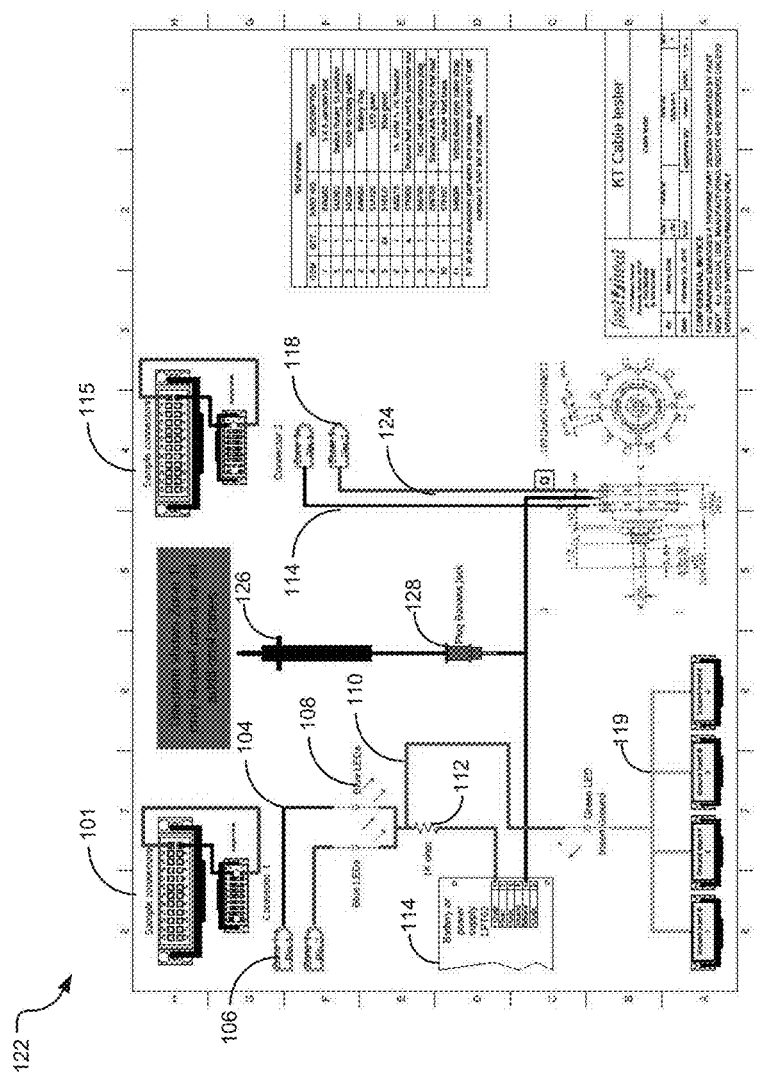
FIG. 1B is a block diagram of a testing apparatus, according to one embodiment of the present disclosure.
Figure 1C:
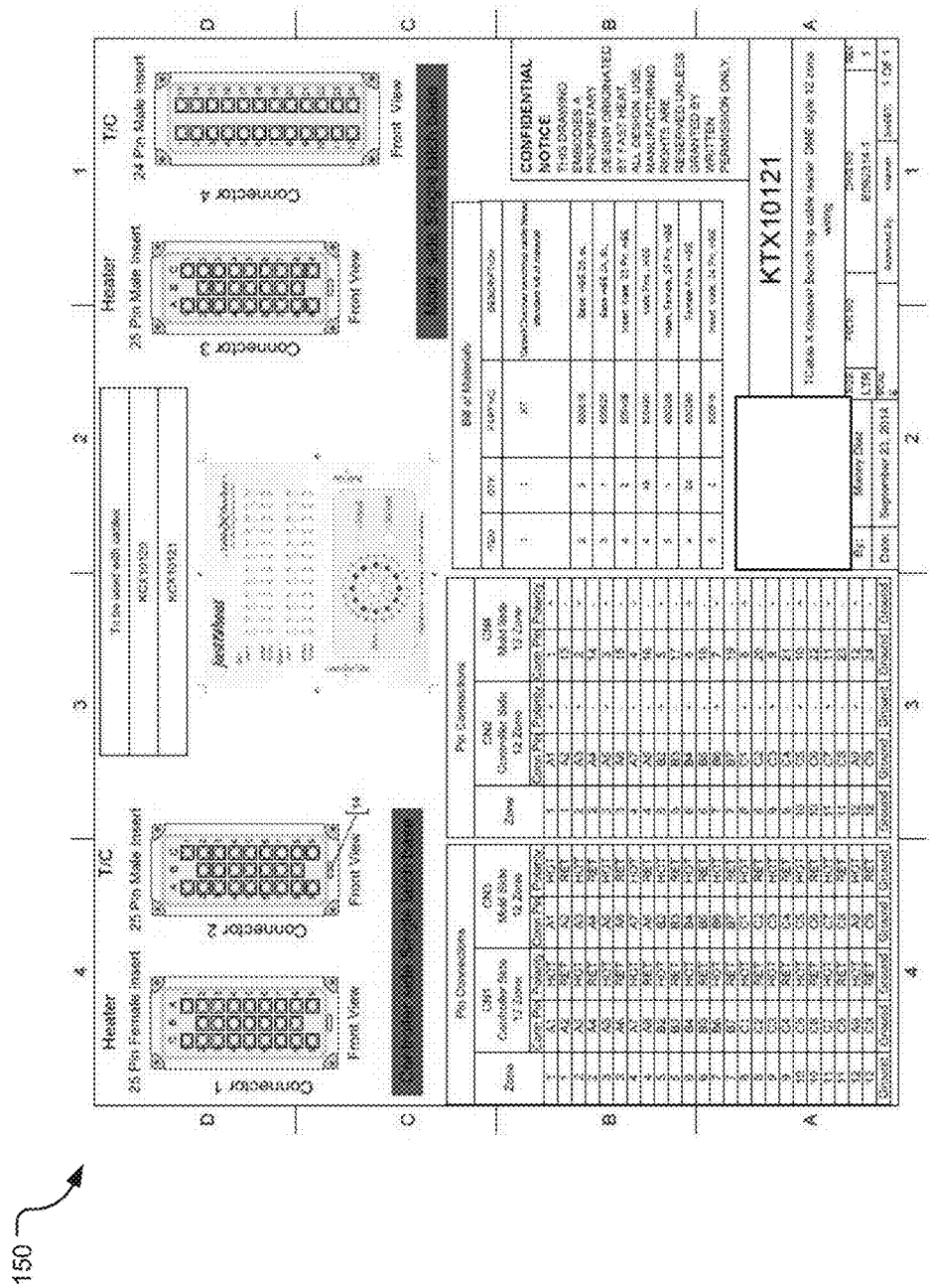
FIG. 1C is an illustration of a user-specified cable wiring diagram, according to one embodiment.

FIG. 1B provides an illustration of a schematic of circuitry 122 that may be included or otherwise implemented within the testing fixture and/or apparatus 100 illustrated in FIG. 1A. In the illustrated embodiment, the circuitry 122 of the testing apparatus 100 includes a first connector 101 that was implemented according to a user-specified wiring diagram 122. FIG. 1C provides an illustration of a user-specified wiring diagram 150. Thus, in one embodiment, the various connectors of the testing device and/or apparatus 100 may be designed according to the user-specified wiring diagram 122.

Referring again to FIG. 1B, the first connector 101 includes a first connector pin that is wired to a first wire 104 of a cable identified for testing, collectively referred to herein as a Zone 1+Pin 1 (illustrated at 106). The Zone 1+Pin 1 may be operatively attached and/or otherwise connected (e.g., soldered) to one or more light emitting diodes ("LED") (e.g., a blue colored LED) 108 on the anode side, although other arrangements are contemplated. Stated differently, one or more LEDs mounted in the housing are operatively interconnected with the housing/casing 132. In such an embodiment, the cathode side may be operatively connected (e.g., soldered) to another, different wire 110, that is connected or otherwise attached to some form of a resister 112 (e.g., a 1K ohm resister) and a battery or power source 114 (e.g., a 9 volt battery), thereby completing the circuit for the first connector 101. Similar connections are completed for each wire in the cable, wherein each wire includes a corresponding LED. In one embodiment, the corresponding LED may be determined according to the specific connecter pin number PTP wiring diagram used to implement or otherwise design the testing apparatus 100.

The testing apparatus 100 may include a second connector 115 that operates similar to connector 101. The connector 115 includes a second connector pin 116 that is wired to a second wire identified for testing, collectively referred to herein as a Zone 1+Pin 2 (illustrated at 118). The Zone 1+Pin 2 118 may also be operatively connected (e.g., soldered) to a single pole 124 throw away rotary switch that includes a wire attached to the power supply. In other embodiments, the may be connected to the D/C ground which in turn is connected to the power source 114. The connection process is completed for each wire in the cable, wherein each wire includes a corresponding LED. In one embodiment, the corresponding LED may be determined according to the specific connecter pin number PTP wiring diagram used to implement or otherwise design the testing apparatus 100.

Each of the connectors—the first connector 101 and the second connector 115—may be operatively connected to one or more ground connections 119. In one embodiment, a wire of the cable may be placed on all of the connector grounds in parallel and soldered to an LED (e.g., a green LED) on the anode side. In such an embodiment, the cathode side of the LED is connected (e.g., soldered) to another wire that is attached to a 1K ohm resister and the power source 114.

Referring again to FIG. 1B, the testing apparatus 100 may include a test lead 126 that is used to manually test the cable. The test lead 126 is configured to be inserted into a banana jack plug 128 (in the illustrated embodiment a banana jack plug), which has a wire connected to the solder pin and is attached to the power source 114, such as to the negative of a 9 volt battery. In another embodiment, the power source may be connected to the ground power source (this completes the circuit for the test lead).

Figure 2:
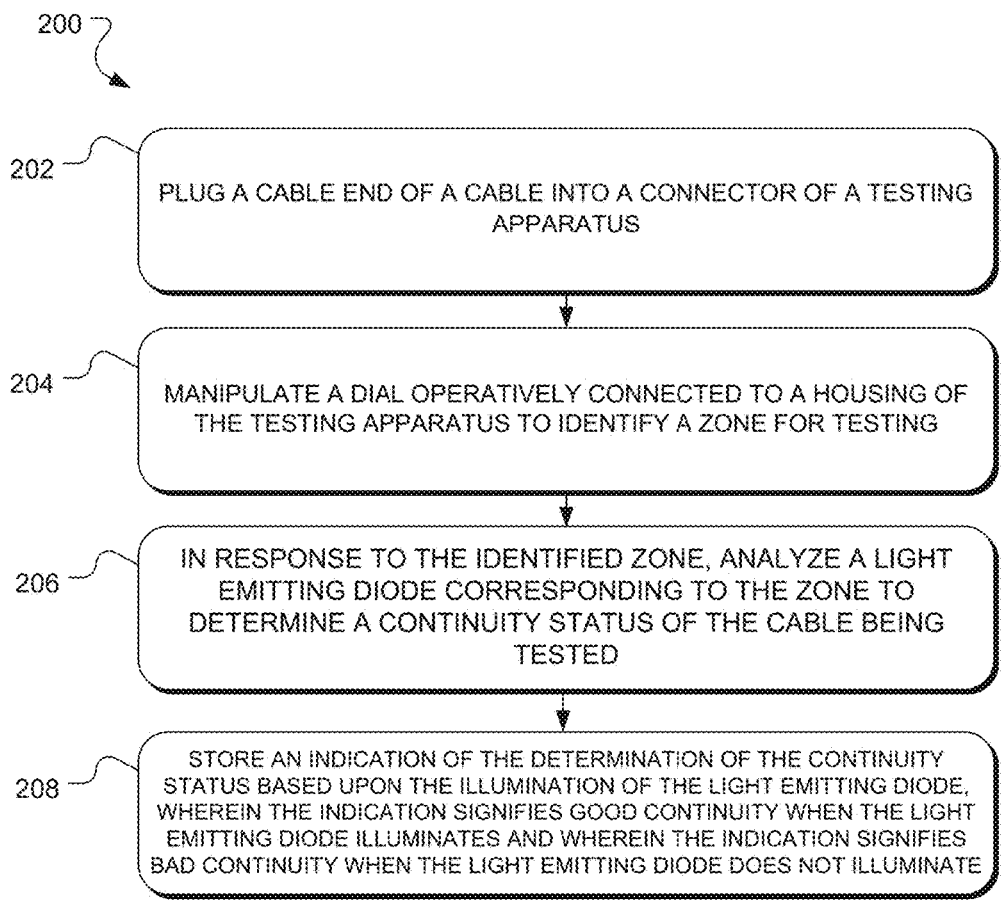
FIG. 2 provides an example illustration of a process for testing a cable, according to one embodiment of the present disclosure.
Figure 3:
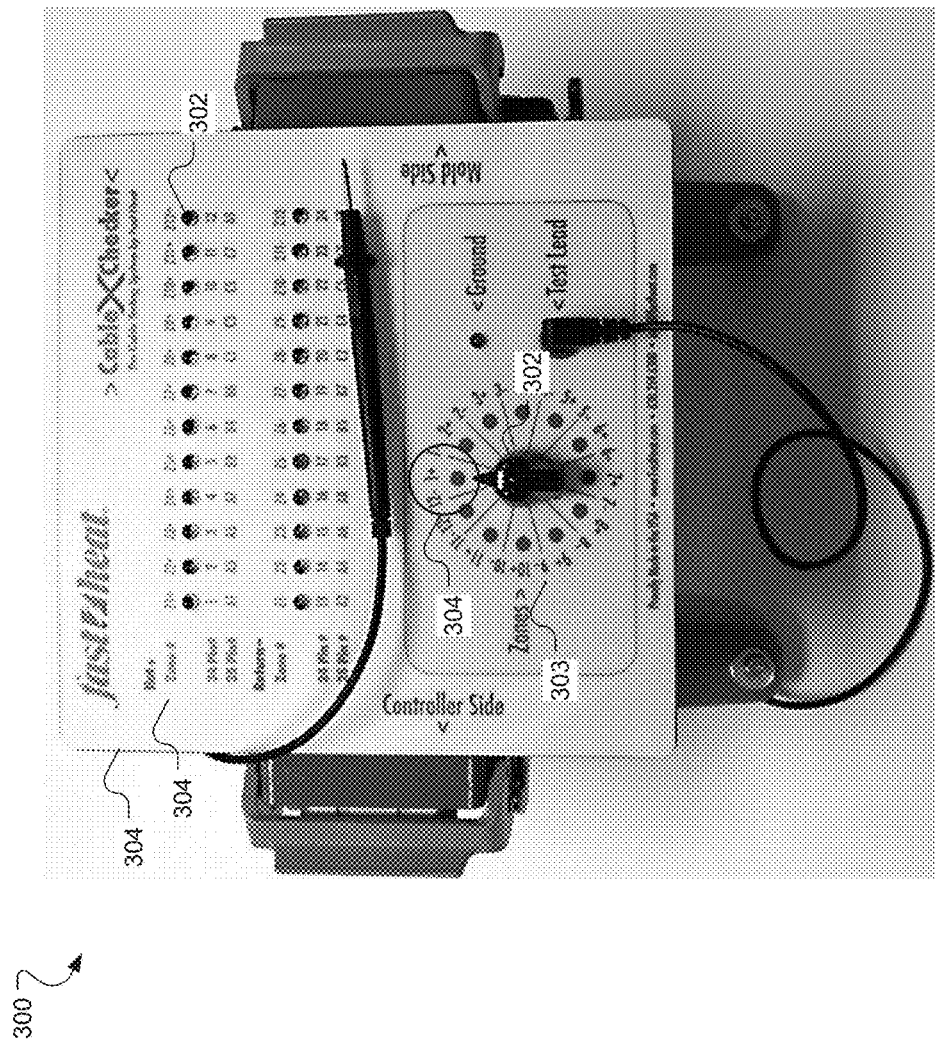
FIG. 3 is a block diagram of another testing apparatus, according to one embodiment of the present disclosure.

FIG. 2 provides an illustration of a process 200 for employing a testing apparatus (e.g., the testing apparatus 100) to test a cable designated by a user. As illustrated, at 202, process 200 begins with plugging cable wire ends into the appropriate connectors on each side of the testing apparatus. In one embodiment, the connections may be color-coded to identify the type of cable being connected to the device. For example, the connection may be red to indicate a heater cable and blue to indicate thermocouple cables. At 204, user-input is provided to the testing apparatus to indicate which zone (e.g., Zone 1 or Zone 2) is currently being tested by the testing apparatus. FIG. 3 provides an illustration of a user providing input to the testing apparatus (e.g., the test apparatus 100) and a corresponding Zone being illuminated, according to one embodiment. In the illustrated embodiment, a dial 302 operatively connected to the housing 304 of the testing apparatus 300 is manipulated to identify Zone 1. When the dial 302 is properly manipulated against a dial guide 303, the LED corresponding to Zone 1 is potentially illuminated (illustrated at 306). To identify Zone 2, the dial 302 is again manipulated to the appropriate section of the dial guide 303 to identify Zone 2. When the dial 302 is properly manipulated against the dial guide 303, the LED corresponding to Zone 2 is potentially illuminated. The process for identifying Zones using the dial 302 is continued for each zone as necessary, will potentially illuminating the corresponding LED.

Referring again to FIG. 2, at 206, in response to the identified zone and corresponding LED, the output of each respective LED is analyzed to determine the continuity of the cable currently being tested. In one embodiment, when each identified zone illuminates the correct LED, the cable includes good continuity. Alternatively, when any identified zone fails to illuminate the correct LED, then there is a loss of continuity in the cable at the wire that corresponds to the LED. In yet another embodiment, if any single identified zone illuminates more than one LED then there is a shortage somewhere between zones. In one embodiment, if any step illuminates the wrong LED, then the cable is improperly wired. At 208, any of such results may be stored or otherwise maintained at a processing unit included within the testing apparatus 100.

In some instances, the cable may be manually tested using a probe. More specifically, the probe allows for the manual testing of the cables, which is handy for testing cables with (mold end connectors) that are different than the connector on the cable tester box. The probe is also the only way to test the ground on the cable. For example, to manually test the cable, the end (controller end) of the cable may be plugged into the testing apparatus 100. Subsequently, the probe may be used to touch each pin on a connector (e.g., first connector 101, second connector 115) at the opposite end of the cable and the corresponding LED should illuminate when contact is made. To test ground, the end (controller end) of the cable may be plugged into the testing apparatus 101. Subsequently, the probe may be touched to the ground strip on a given connector and, in response, the ground LED should illuminate. Subsequently, the probe may be touched to the ground strip on a given connector and, in response, the ground LED should illuminate.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided, in part, as a computer program product, or software, that may include a machine-readable medium having stored thereon instructions, which may be used to program portions of the testing apparatus 100, other computer system, or other electronic devices, to perform the various processes described in the present disclosure. A machine-readable medium includes any mechanism for storing information in a form (e.g., software, processing application) readable by a machine (e.g., a computer). The machine-readable medium may include, but is not limited to, magnetic storage medium, optical storage medium (e.g., CD-ROM); magneto-optical storage medium, read only memory (ROM); random access memory (RAM); erasable programmable memory (e.g., EPROM and EEPROM); flash memory; or other types of medium suitable for storing electronic instructions.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

Those skilled in the art will appreciate that variations from the specific embodiments disclosed above are contemplated by the invention. The following invention should not be restricted to the above embodiments, but should be measured by the following claims.

What is claimed is:

1. A testing apparatus for testing a cable comprising:
a dial operatively connected to a housing containing:
   a first electrical connector, wherein the first electrical connector is:
      wired to a first wire of a cable; and
      operatively connected to a first visual indicator connected to at least one first resistor and a power source;
   a second electrical connector, wherein the second electrical connector is:
      wired to a second wire of the cable; and
      and operatively connected to a second visual indicator connected to at least one second resistor and the power source; and
   wherein, in response to manipulating the dial to identifying a first zone corresponding to the first wire and the first visual indicator, the first electrical connector is configured to illuminate the first visual indicator;
   wherein, in response to manipulating the dial to identifying a second zone corresponding to the second wire and the second visual indicator, the first electrical connector is configured to illuminate a second visual indicator; and
   wherein the cable is functioning properly when the first visual indicator and the second visual indicator both illuminate.

2. The apparatus of claim 1, wherein the cable is not functioning properly when the first visual indicator and the second visual indicator do not both illuminate.

3. The apparatus of claim 1, wherein the first electrical connector and the second electrical connector are implemented according to a wiring diagram provided by a customer.

4. The apparatus of claim 1, further comprising a third electrical connector, wherein the second electrical connector is:
   wired to a third wire of the cable; and
   operatively connected to a third visual indicator connected to at least one second resistor and the power source.

5. The apparatus of claim 1, wherein the first visual indicator and the second visual indicator are light emitting diodes.

6. The apparatus of claim 1, wherein the housing is in the form of a box having a lid, wherein the first and second visual indicators are located protruding through a front surface of the lid.

7. A method for testing a cable comprising:
manipulating a dial to identify a first zone corresponding to a first electrical connector, wherein the first electrical connector is:
   wired to a first wire of a cable; and
   operatively connected to a first visual indicator connected to at least one first resistor and a power source;
manipulating the dial to identify a second zone corresponding to a second electrical connector, wherein the second electrical connector is:
   wired to a second wire of the cable; and
   operatively connected to a second visual indicator connected to at least one first resistor and a power source;
in response to manipulating the dial to identify the first zone corresponding to the first wire and the first visual indicator, illuminate the first visual indicator;
in response to manipulating the dial to identify the second zone corresponding to the second wire and the second visual indicator, illuminate the second visual indicator; and
wherein the cable is functioning properly when the first visual indicator and the second visual indicator both illuminate.

8. The method of claim 7, wherein the cable is not functioning properly when the first visual indicator and the second visual indicator do not both illuminate.

9. The method of claim 7, wherein the first electrical connector and the second electrical connector are implemented according to a wiring diagram provided by a customer.

10. The method of claim 7, further comprising:
manipulating a dial to identify a third zone corresponding to a third electrical connector, wherein the third electrical connector is:
   wired to a third wire of the cable; and operatively connected to a third visual indicator connected to at least one first resistor and a power source.

* * * * *